(12) United States Patent
Zhang et al.

(10) Patent No.: US 10,461,175 B2
(45) Date of Patent: Oct. 29, 2019

(54) TFT-CONTAINING BACKPLATE AND METHOD FOR FABRICATING THE SAME

(71) Applicant: BOE TECHNOLOGY GROUP CO., LTD., Beijing (CN)

(72) Inventors: Jianye Zhang, Beijing (CN); Youngsuk Song, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/865,433

(22) Filed: Jan. 9, 2018

(65) Prior Publication Data

US 2018/0331205 A1 Nov. 15, 2018

(30) Foreign Application Priority Data

May 12, 2017 (CN) .......................... 2017 1 0335245

(51) Int. Cl.
*H01L 21/02* (2006.01)
*H01L 29/66* (2006.01)
*H01L 27/32* (2006.01)
*H01L 27/12* (2006.01)
*H01L 21/311* (2006.01)
*H01L 29/423* (2006.01)

(52) U.S. Cl.
CPC .. *H01L 29/66742* (2013.01); *H01L 21/02172* (2013.01); *H01L 21/311* (2013.01); *H01L 21/31111* (2013.01); *H01L 27/12* (2013.01); *H01L 27/3262* (2013.01); *H01L 27/3272* (2013.01); *H01L 29/42384* (2013.01); *H01L 2029/42388* (2013.01)

(58) Field of Classification Search
CPC ............... H01L 29/66; H01L 29/66742; H01L 29/42384; H01L 21/02; H01L 21/311; H01L 21/82345; H01L 21/823842; H01L 21/8238; H01L 27/124; H01L 27/1251; H01L 27/1248; H01L 27/1237; H01L 29/78678; H01L 29/7831; H01L 29/739; H01L 29/7856; H01L 29/78666; H01L 29/78675
USPC ......................................................... 438/151
See application file for complete search history.

(56) References Cited

U.S. PATENT DOCUMENTS

2006/0006380 A1 1/2006 Shin et al.
2014/0151708 A1* 6/2014 Jeon .................. H01L 29/66969
257/72

(Continued)

FOREIGN PATENT DOCUMENTS

CN 1734350 A 2/2006
CN 101488459 A 7/2009

(Continued)

OTHER PUBLICATIONS

First Office Action for Chinese Patent Application No. 201710335245.3 dated Jun. 4, 2019.

*Primary Examiner* — Chuong A Luu
(74) *Attorney, Agent, or Firm* — Calfee, Halter & Griswold LLP

(57) ABSTRACT

A method for fabricating a TFT-containing backplate is disclosed. The method includes forming a top-gate TFT on a substrate. The top-gate TFT includes a gate insulating layer which includes a negative silicone light shielding material. A TFT-containing backplate is also disclosed.

15 Claims, 3 Drawing Sheets

(56) References Cited

U.S. PATENT DOCUMENTS

2016/0163868 A1    6/2016   Kobayashi et al.
2018/0294360 A1*  10/2018   Zhang ............... H01L 29/78633
2018/0308948 A1   10/2018   Li et al.

FOREIGN PATENT DOCUMENTS

CN          105845721 A      8/2016
CN          109075204 A     12/2018

* cited by examiner

US 10,461,175 B2

TFT-CONTAINING BACKPLATE AND METHOD FOR FABRICATING THE SAME

RELATED APPLICATIONS

The present application claims the benefit of Chinese Patent Application No. 201710335245.3, filed on May 12, 2017, the entire disclosure of which is incorporated herein by reference.

TECHNICAL FIELD

The present disclosure relates to the field of display technology, and particularly to a TFT-containing backplate and a method for fabricating the same.

BACKGROUND

In the field semiconductor technology, due to its advantages like high mobility, simple process, low cost, uniformity over a large area, a metal oxide TFT (thin film transistor) has gradually replaced the conventional amorphous silicon (a-Si) TFT and low-temperature polycrystalline silicon (LTPS) TFT, and has become a key device for driving an OLED display panel.

Currently, the metal oxide TFT is also of great interest in AMOLED (active matrix organic light emitting diode) of the next generation technology innovation, which is also called as an OLED display panel. WOLED+CF (i.e., RGBW color filters are used in combination with a white OLED light emitting material to realize color display) represents a development trend of the AMOLED. It has attracted much attention due to advantages like a high utilization rate of an organic EL material, a low requirement for the evaporation mask, and a large aperture ratio when a top-gate metal oxide TFT is adopted.

SUMMARY

In an aspect, embodiments of the present disclosure provide a method for fabricating a TFT-containing backplate, comprising: forming a top-gate TFT on a substrate, wherein the top-gate TFT comprises a gate insulating layer which comprises a negative silicone light shielding material.

In an embodiment, the negative silicone light shielding material is a photo-curable silicone material which comprises a light shielding material.

In an embodiment, the light shielding material comprises a black fluran dye or a crystal violet nitriles dye.

In an embodiment, forming the top-gate TFT on the substrate comprises:

depositing a first metal layer on the substrate, and patterning the first metal layer to form a source and a drain;

depositing a metal oxide layer on the substrate on which the source and the drain have been formed;

depositing a first insulating layer on the metal oxide layer, and patterning the first insulating layer by self-alignment exposure to form the gate insulating layer which has an inverted trapezoid cross-sectional shape; and depositing a second metal layer to form a gate on the gate insulating layer.

In an embodiment, the method further comprises:

depositing a second insulating layer on the substrate on which the gate has been formed, and patterning the second insulating layer to form a contact hole which partially exposes the drain; and depositing a third metal layer, and patterning the third metal layer to form a common electrode which is electrically connected with the drain through the contact hole.

Forming the gate insulating layer comprises:

spin coating the negative silicone light shielding material on the metal oxide layer; and performing exposure on the negative silicone light shielding material from a side facing the substrate, and performing development to form the gate insulating layer which has an inverted trapezoid cross-sectional shape.

In an embodiment, the method further comprises: after forming the gate insulating layer which has an inverted trapezoid cross-sectional shape, and prior to coating the positive photoresist, wet etching the metal oxide layer to form an active layer In an embodiment, the method further comprise: after forming the gate, and prior to depositing the second insulating layer, wet etching the metal oxide layer to form an active layer.

In an embodiment, forming the gate comprises: coating a positive photoresist on the substrate on which the gate insulating layer has been formed; patterning the positive photoresist, to retain the positive photoresist over the source and the drain and remove the positive photoresist over the gate insulating layer; depositing the second metal layer; and lifting off a stack of the positive photoresist and the second metal layer over the source and the drain, and retaining the second metal layer over the gate insulating layer to form the gate In an embodiment, the first metal layer, the metal oxide layer, the first insulating layer, the second metal layer, the second insulating layer and the third metal layer are deposited by physical vapor deposition, chemical vapor deposition, atomic layer deposition or laser deposition.

In an embodiment, depositing the first metal layer on the substrate comprises: depositing the first metal layer on the substrate by sputtering.

In an embodiment, the first metal layer comprises Cu, Al, or MoNb/Cu/MoNb.

In an embodiment, the metal oxide layer comprises IGZO, ZnON or ITZO.

In an embodiment, the active layer has a thickness of 500 nm-1000 nm.

In an embodiment, the gate is made from a single metal layer or multiple metal layers, and the single metal layer or each of the multiple metal layers comprise Cu, Al, Mo, Ti, Ag, Au, Ta, Cr or Al alloy.

In another aspect, embodiments of the present disclosure further provide a TFT-containing backplate, comprise a substrate and a source, a drain, an active layer, a gate insulating layer, and a gate which are formed on the substrate in this order, wherein the gate insulating layer comprises a negative silicone light shielding material.

In an embodiment, the negative silicone light shielding material is a photo-curable silicone material which comprises a light shielding material.

In an embodiment, the light shielding material comprises a black fluran dye or a crystal violet nitriles dye.

DETAILED DESCRIPTION OF EMBODIMENTS

The display substrate, the method for fabricating the same, the display panel, and the display apparatus in embodiments of the present disclosure will be described in detail hereinafter with reference to the accompanying drawing.

The metal oxide TFT has drawn attention due to its various advantages. However, as for the choice of channel layer semiconductor which is a key technique, not only the mobility but also the process complexity shall be considered. In addition, the metal oxide TFT generally suffers from the problems that a switch TFT has a large parasitic capacitance, the fabrication process is complex, and the yield of product is low.

According to embodiments of the present disclosure, a method for fabricating a TFT-containing backplate comprises: forming a top-gate TFT on a substrate, wherein the top-gate TFT comprises a gate insulating layer which comprises a negative silicone light shielding material. For example, the negative silicone light shielding material is a photo-curable silicone material which comprises a light shielding material. For example, the light shielding material comprises a black fluran dye or a crystal violet nitriles dye.

In the above method, the negative silicone light shielding material is adopted to form the gate insulating layer in one step. As a result, the deposition and dry etching of a SiOx film are omitted. This simplifies the fabricating process, and improves the process efficiency. The resulting top-gate TFT has a small parasitic capacitance, improves device performance, and further improves the product yield.

Figure 1:
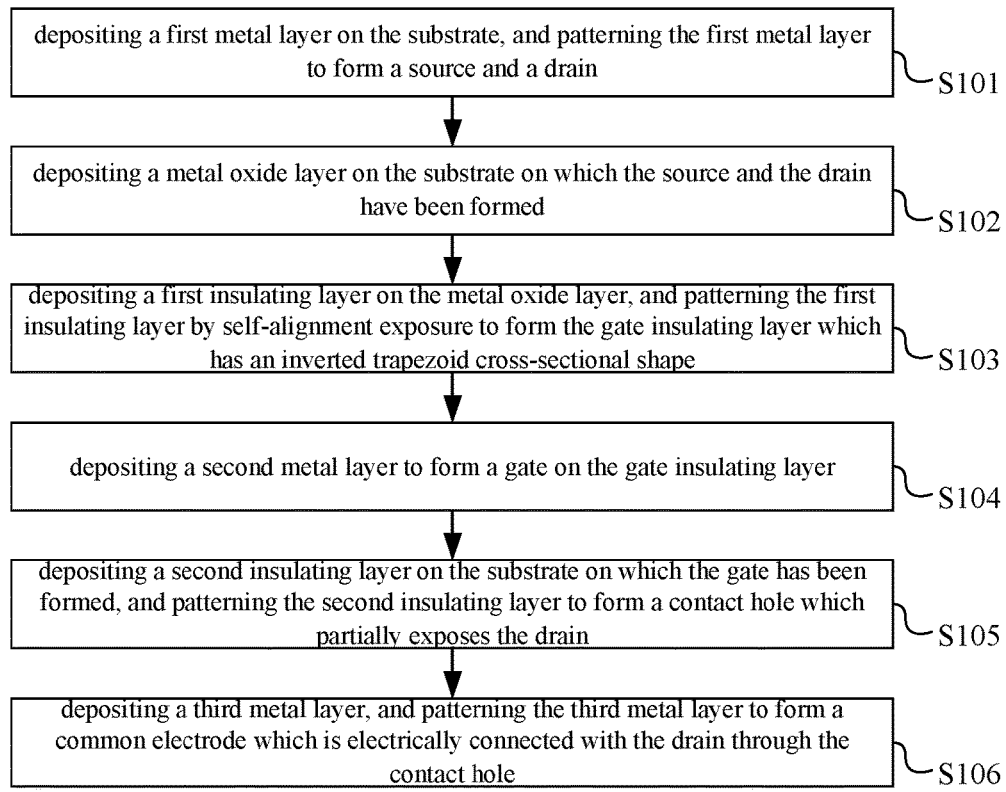
FIG. 1 is a flow chart for illustrating a method for fabricating a TFT-containing backplate in an embodiment of the present disclosure.

In an exemplary embodiment, as shown in FIG. 1, the above method for fabricating a TFT-containing backplate comprises the following steps.

Step S101, a first metal layer is deposited on a substrate, and the first metal layer is patterned to form a source and a drain.

Step S102, a metal oxide layer is deposited on the first metal layer on which the source and the drain have been formed.

Step S103, a first insulating layer is deposited on the metal oxide layer, and the first insulating layer is patterned by a self-alignment exposure to form a gate insulating layer which has an inverted trapezoid cross-sectional shape. The term "an inverted trapezoid" as used herein refers to a trapezoid in which an upper base is longer than a lower base.

Step S104, a second metal layer is deposited to form a gate on the gate insulating layer.

Step S105, a second insulating layer is deposited, and the second insulating layer is patterned to form a contact hole which partially exposes the drain.

Step S106, a third metal layer is deposited and patterned to form a common electrode which is electrically connected with the drain through the contact hole.

In the above method, optionally, the substrate is subject to cleaning with a conventional procedure. During forming the source and the drain in step S101, the first metal layer can be deposited on the substrate for example by sputtering, and then the first metal layer is patterned to form the source and the drain. In embodiments of the present disclosure, the patterning process may comprise photolithography, baking, etching, lifting off, or the like. In step S102, the metal oxide is deposited on the first metal layer on which the source and the drain have been formed. In step S103, when the first insulating layer is deposited to form the gate insulating layer, since the gate insulating layer adopts a negative silicone light shielding material, the deposition and dry etching steps of a film of SiOx are omitted. This simplifies the fabricating process, and improves the process efficiency. Then, the first insulating layer is patterned by a self-alignment exposure procedure to form the gate insulating layer which has an inverted trapezoid cross-sectional shape. In step S104, the second metal layer is deposited to form the gate on the gate insulating layer. In step S105, the second insulating layer is deposited, and the second insulating layer is patterned with a mask (or a same mask as the above step) to form the contact hole. In the patterning process, exposure and development are performed to form a pore in the insulating layer, so as to form the contact hole. Finally, in step S106, the third metal layer is deposited and patterned to form the common electrode.

The resulting top-gate TFT from the above steps has a small parasitic capacitance, improves the device performance, and further improves the product yield.

In particular, the deposition method comprises physical vapor deposition, chemical vapor deposition, atomic layer deposition or laser deposition. The deposition method may be selected according to practical situations of the method for fabricating a TFT-containing backplate (e.g., the process requirements and the restrictions of equipment).

The flow chart shown in FIG. 1 will be described hereinafter with reference to FIGS. 2A-2I.

Figure 2A:
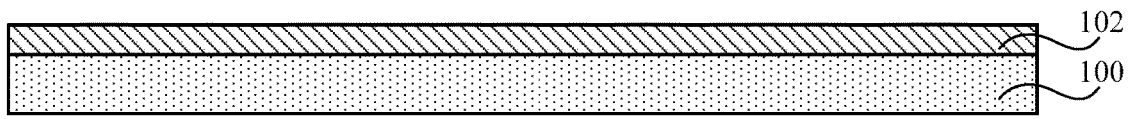
FIGS. 2A, 2B, 2C, 2D, 2E, 2F, 2G, 2H and 2I are cross-sectional views for illustrating a TFT-containing backplate during various process steps in an embodiment of the present disclosure.

As shown in FIG. 2A, a first metal layer 102 is deposited on a substrate 100 for example by sputtering. The first metal layer 102 comprises Cu, Al, or a layer stack of MoNb/Cu/MoNb. Further, the first metal layer 102 may be made from other metallic materials.

Figure 2B:
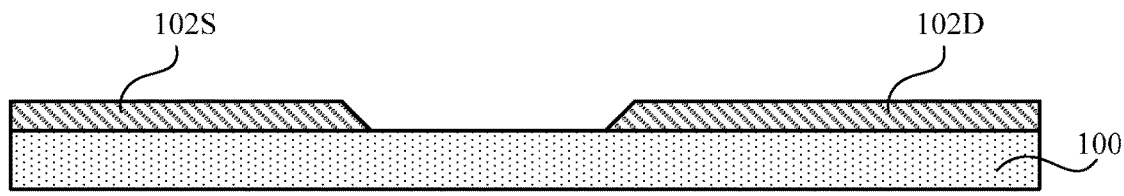

As shown in FIG. 2B, the first metal layer 102 is patterned to form a source 102S and a drain 102D.

Figure 2C:
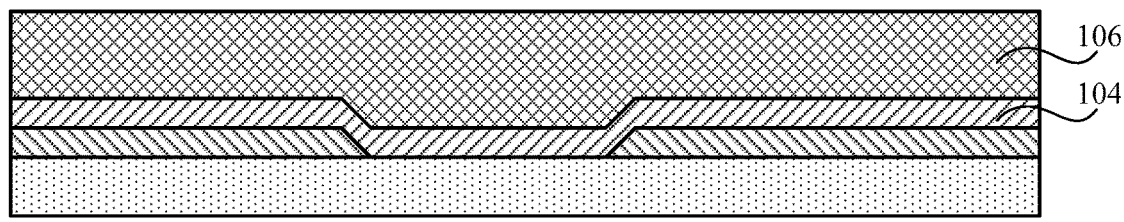

As shown in FIG. 2C, after the source 102S and the drain 102D have been formed, a metal oxide layer 104 is deposited on the substrate 100. Then, a first insulating layer 106 comprising a negative silicone light shielding material is deposited on the metal oxide layer 104.

Figure 2D:
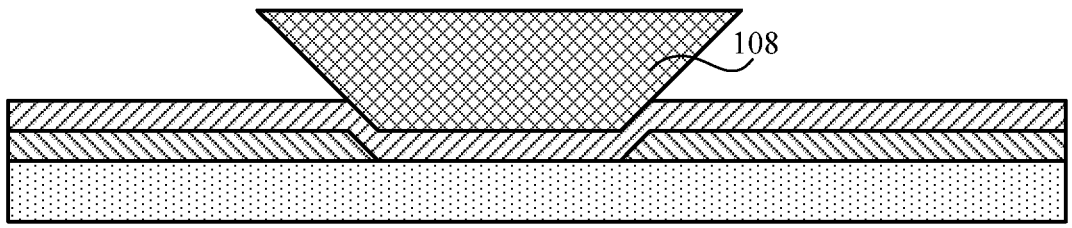

As shown in FIG. 2D, the first insulating layer 106 is patterned by self-alignment exposure to form a gate insulating layer 108 which has an inverted trapezoid cross-sectional shape. For example, the first insulating layer 106 is subject to exposure from a side facing the substrate 100, and is subject to development to form the gate insulating layer 108 which has an inverted trapezoid cross-sectional shape.

In an exemplary embodiment, after forming the gate insulating layer 108 which has an inverted trapezoid cross-sectional shape, the metal oxide layer 104 is subject to wet etching to form an active layer (not shown in FIG. 2D).

Figure 2E:
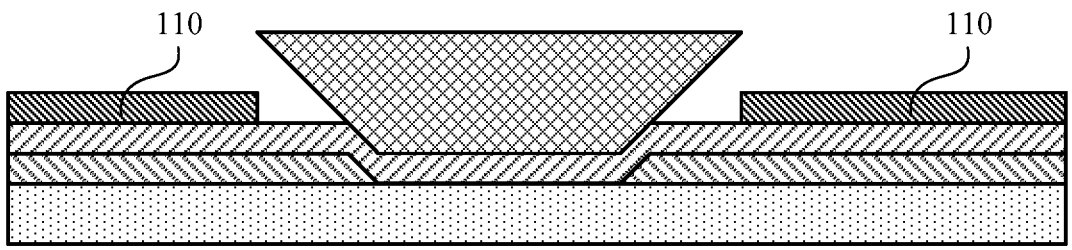

As shown in FIG. 2E, a positive photoresist 110 is coated on the substrate 100. The positive photoresist 110 is patterned to retain the positive photoresist 110 over the source 102S and the drain 102D, and remove the positive photoresist 110 over the gate insulating layer 108. In this step, the positive photoresist is patterned for example by exposure development, so that the positive photoresist over the gate insulating layer is removed. This can omit the processes for fabricating a mask to reduce procedure. Besides, this can effectively reduce the effect of light leakage in the light emitting region the active region, which effectively improves product yield and device performance.

Figure 2F:
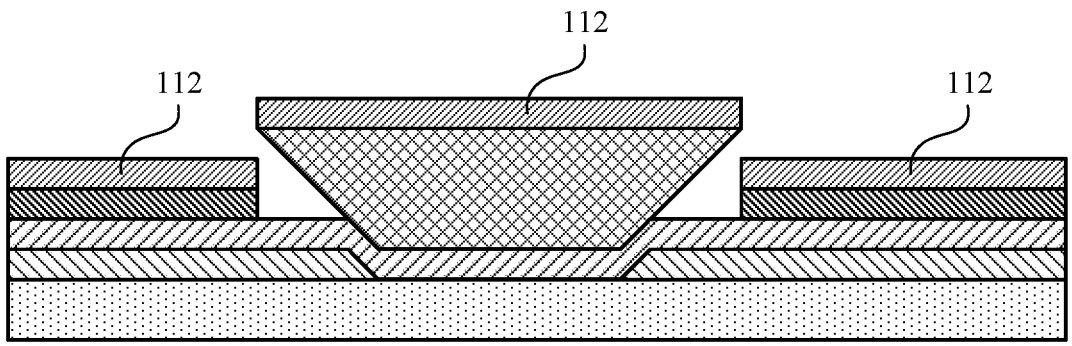

As shown in FIG. 2F, a second metal layer 112 is deposited.

Figure 2G:
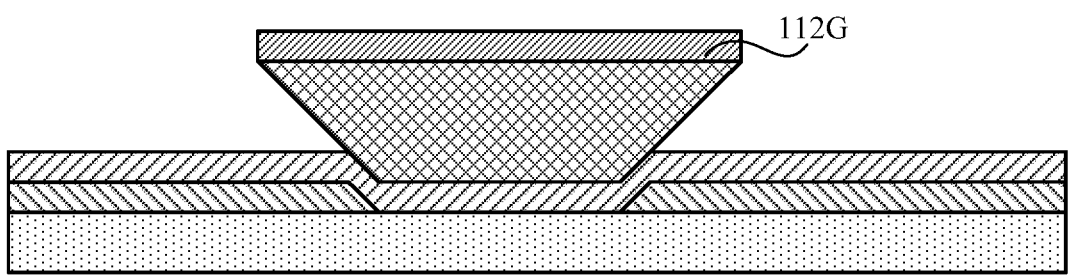

As shown in FIG. 2G, a stack comprising the positive photoresist 110 and the second metal layer 112 over the source 102S and the drain 102D is lifted off, and the second metal layer 112 over the gate insulating layer 108 is retained to form a gate 112G.

Figure 2H:
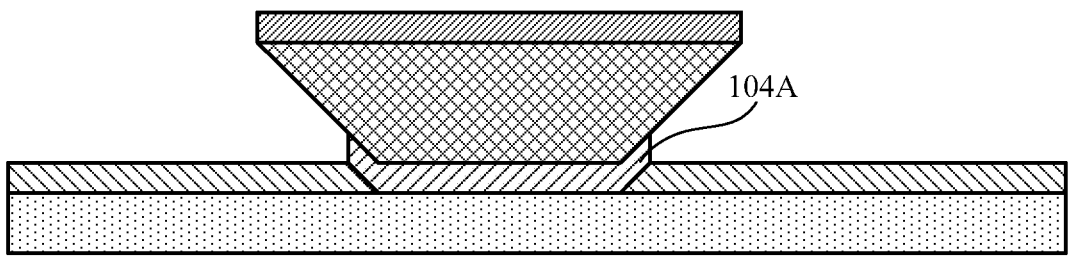

As shown in FIG. 2H, after the gate 112G is formed, the metal oxide layer 104 is subject to wet etching to form an active layer 104A.

Figure 2I:
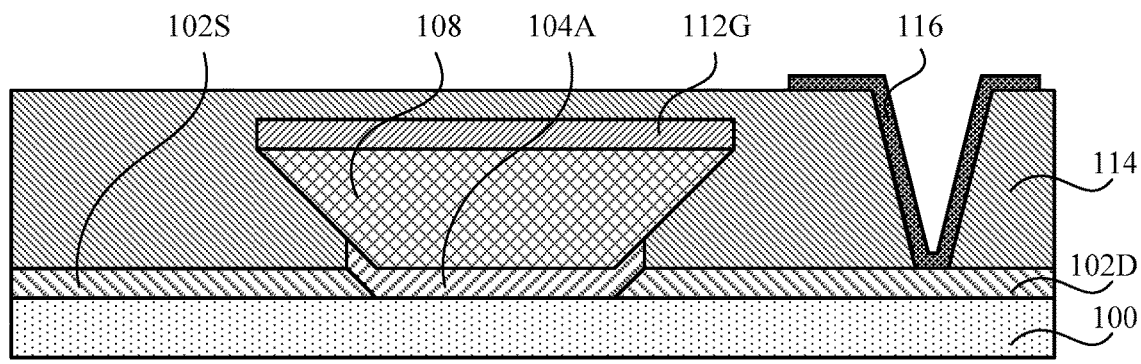

As shown in FIG. 2I, a second insulating layer 114 is deposited, and is pattern to form a contact hole which partially exposes the drain 102D. A third metal layer is deposited and patterned to form a common electrode 116 which is electrically connected with the drain 102D through the contact hole. In particular, the metal oxide is IGZO (indium gallium zinc oxide), ZnON (zincoxynitride) or ITZO (indium tin zinc oxide). In addition, the metal oxide can be made from other metallic materials.

In particular, the active layer has a thickness of 500 nm-1000 nm. For example, the active layer has a thickness of about 500 nm, 600 nm, 700 nm, 800 nm, 900 nm or 1000 nm. The thickness of active layer can be selected according to the method for fabricating the TFT-containing backplate.

In the above method, a negative silicone light shielding material is spin coated the first insulating layer to form a coating with a thickness about 2 μm, and the coating is subject to a back channel design and a backside exposure to form the inverted trapezoid cross-sectional shape. Then a positive photoresist is coated, and is subject to a patterning process comprising exposure and development to form a structure in which difference in height is easily to remove by lifting off. The photoresist in a region other than the gate insulating layer is retained, which facilitates lifting off in the subsequent process. This efficiently improves the fabrication rate, because only one film deposition procedure and one dry etching procedure are needed to form the pattern of gate and active layer.

In the above method, the source, the drain, the active layer, the gate insulating layer, the gate metal layer, the contact hole and the common electrode can be formed with four masks. This saves masks, improves the process efficiency and product yield, and reduces parasitic capacitance.

In particular, the gate metal layer is a single metal layer or multiple metal layers, and each of the metal layers is formed of Cu, Al, Mo, Ti, Ag, Au, Ta, Cr or Al alloy.

In addition, the present disclosure further provides a TFT-containing backplate, comprising a substrate and a source, a drain, an active layer, a gate insulating layer, and a gate which are formed on the substrate in this order, wherein the gate insulating layer comprises a negative silicone light shielding material.

Since the photo-curable silicone material is a negative photoresist, the silicone photoresist material is added with a light shielding material to form a negative silicone light shielding material. The negative silicone light shielding material forms the gate insulating layer, and the resulting top-gate TFT has a small parasitic capacitance. This improves device performance, and further improves the product yield.

In an exemplary embodiment, the negative silicone light shielding material comprises a black fluran dye or a crystal violet nitriles dye. By adding the negative silicone light shielding material with a black fluran dye or a crystal violet nitriles dye, a light shielding effect of the gate insulating layer made from the negative silicone light shielding material can be enhanced.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method or fabricating a TFT-containing backplate, comprising: forming a top-gate TFT on a substrate, wherein the top-gate TFT comprises a gate insulating layer which comprises a negative silicone light shielding material,
wherein forming the top-gate TFT on the substrate comprises:
depositing a first metal layer on the substrate, and patterning the first metal layer to form a source and a drain;
depositing a metal oxide layer on the substrate on which the source and the drain have been formed;
depositing a first insulating layer on the metal oxide layer, and patterning the first insulating layer by self-alignment exposure to form the gate insulating layer which has an inverted trapezoid cross-sectional shape; and
depositing a second metal layer to form a gate on the gate insulating layer.

2. The method of claim 1, wherein the negative silicone light shielding material is a photo-curable silicone material which comprises a light shielding material.

3. The method of claim 2, wherein the light shielding material comprises a black fluran dye.

4. The method of claim 1, further comprising;
depositing a second insulating layer on the substrate on which the gate has been formed, and patterning the second insulating layer to form a contact hole which partially exposes the drain; and
depositing a third metal layer, and patterning the third metal layer to form a common electrode which is electrically connected with the drain through the contact hole.

5. The method of claim 1, wherein forming, the gate insulating layer comprises:
spin coating the negative silicone light shielding material on the metal oxide layer; and
performing exposure on the negative silicone light shielding material from a side facing the substrate, and performing development to form the gate insulating layer which has an inverted trapezoid cross-sectional shape.

6. The method of claim 1 further comprising:
after forming the gate insulating layer which has an inverted trapezoid cross-sectional shape, and prior to coating the positive photoresist, wet etching the metal oxide layer to form an active layer.

7. The method of claim 4, further comprising:
after forming the gate, and prior to depositing the second insulating layer, wet etching the metal oxide layer to form an active layer.

8. The method of claim 1, wherein forming the gate comprises:
coating a positive photoresist on the substrate on which the gate insulating layer has been formed;
patterning the positive photoresist, to retain the positive photoresist over the source and the drain and remove the positive photoresist over the gate insulating layer;
depositing the second metal layer; and lifting off a stack of the positive photoresist and the second metal layer over the source and the drain, and retaining the second metal layer over the gate insulating layer to form the gate.

9. The method of claim 4, wherein the first metal layer, the metal oxide layer, the first insulating layer, the second metal layer, the second insulating layer and the third metal layer are deposited by physical vapor deposition, chemical vapor deposition, atomic layer deposition or laser deposition.

10. The method of claim 9, wherein depositing the first metal layer on the substrate comprises: depositing the first metal layer on the substrate by sputtering.

11. The method of claim 10, wherein the first metal layer comprises Cu, Al, or MoNb/Cu/MoNb.

12. The method of claim 1, wherein the metal oxide layer comprises IGZO, ZnON or ITZO.

13. The method of claim 6, wherein the active layer has a thickness of 500 nm-1000 nm.

14. The method of claim 1, wherein the gate is made from a single metal layer or multiple metal layers, and the single metal layer or each of the multiple metal layers comprises Cu, Al, Mo, Ti, Ag, Au, Ta, Cr or Al alloy.

15. The method of claim 2, wherein the light shielding material comprises a crystal violet nitriles dye.

* * * * *